United States Patent

Huang et al.

[11] Patent Number: 6,078,087
[45] Date of Patent: Jun. 20, 2000

[54] SRAM MEMORY DEVICE WITH IMPROVED PERFORMANCE

[75] Inventors: Kuo Ching Huang, Kaohsiung; Yean-Kuen Fang, Tainan; Mong-Song Liang; Cheng-Yeh Shih, both of Hsin-Chu; Dun Nian Yaung, Taipei, all of Taiwan

[73] Assignee: Taiwan Semiconductor Manufacturing Company, Hsin-Chu, Taiwan

[21] Appl. No.: 09/379,230

[22] Filed: Aug. 23, 1999

Related U.S. Application Data

[62] Division of application No. 09/067,151, Feb. 27, 1998, Pat. No. 5,953,606.

[51] Int. Cl.[7] .................................................. H07L 27/11
[52] U.S. Cl. ............................................ 257/393; 257/903
[58] Field of Search .................................. 257/393, 903, 257/904

[56] References Cited

U.S. PATENT DOCUMENTS

| | | | |
|---|---|---|---|
| 5,281,843 | 1/1994 | Ochii et al. | 257/393 |
| 5,331,170 | 7/1994 | Hayashi | 257/393 |
| 5,535,155 | 7/1996 | Abe | 257/393 |
| 5,780,909 | 7/1998 | Hayashi | 257/393 |

*Primary Examiner*—David Hardy
*Attorney, Agent, or Firm*—George O. Saile; Stephen B. Ackerman; Grahams S. Jones, II

[57] ABSTRACT

A contact between a conductor and a substrate region in a MOSFET SRAM device is formed by a dielectric layer on the surface of a partially completed SRAM device with pass transistors and latch transistors with the dielectric layer being formed above those pass and latch transistors. A thin film transistor gate electrode and an interconnection line are formed on the upper surface of the dielectric layer. A gate oxide layer covers the gate electrode and the interconnection line. A polysilicon conductive layer which covers the gate oxide layer includes a channel region between a source region and a drain region which are formed on opposite sides of the channel region. There is a channel mask formed self-aligned with the channel region formed above the channel region as well as being above the gate electrode. The polysilicon conductive layer is doped aside from the channel mask thereby providing a source region and a drain region on opposite sides of the channel region. A doped interconnect line is also formed in the polysilicon conductive layer. There is a contact which extends through the gate oxide layer between the interconnection line and the polysilicon conductive layer.

11 Claims, 4 Drawing Sheets

SRAM MEMORY DEVICE WITH IMPROVED PERFORMANCE

This is a division of patent application Ser. No. 09/067,151, filing date Feb. 27, 1998, Method For Manufacturing A Tft Sram Memory Device With Improved Performance And The Device Manufactured Thereby, assigned to the same assignee as the present invention, now U.S. Pat. No. 5,953,606.

BACKGROUND OF THE INVENTION

1. Field of the Invention

This invention relates to Complementary Metal Oxide Semiconductor (CMOS) Field Effect Transistor (FET) memory devices Static Random Access Memory (SRAM) memory integrated circuit semiconductor cells and more particularly to the load transistors of SRAM devices.

2. Description of Related Art

Integrated circuit (IC) memory devices are made up of a plurality of memory cells. In general, one basic memory cell design is duplicated numerous times to form those cells. The basic cell design may be modified slightly from cell to cell, for example one cell may be a reversed image or complement of an adjacent cell, but the entire memory device can be described according to the basic cell design.

In the case of Static Random Access Memory (SRAM) devices, the basic cell is usually in one of two forms, either a six transistor (6T) cell or four transistor/two resistor (4T/2R) cell. Many conventional SRAMs using a 6T configuration have six transistors formed in a bulk semiconductor substrate such as single crystal silicon. That type of SRAM is usually embodied in a Complementary Metal Oxide Semiconductor (CMOS) technology, with four transistors being N-channel devices while the remaining two transistors are P-channel devices. A 6T SRAM device operates at relatively low power levels and the bulk transistors have good electrical characteristics, including high mobility and low threshold voltages. Also 6T SRAMs are relatively stable, having high immunity to cell errors, such as those caused by incident alpha particles. However, 6T SRAM cells formed of transistors in a bulk substrate require a large area because the transistors are formed next to one another in the substrate and are essentially in the same plane; which use of six bulk transistors imposes an undesirable lower limit on the cell size. Achieving the smallest cell size with the simplest process reduces the manufacturing costs, increases memory capacity, and increases the device performance without increasing the overall device size.

U.S. Pat. No. 5,059,554 of Spinner et al. teaches a "Method for Forming Polycrystalline Silicon Contacts" between polycrystalline interconnect and underlying polycrystalline or monocrystalline silicon regions. After contact openings are formed, a layer of titanium is deposited over the integrated circuit. The titanium is reacted in nitrogen to form a silicide layer only in the openings. Titanium nitride and unreacted titanium are then removed, and a layer of polysilicon is deposited and patterned.

U.S. Pat. No. 5,151,387 of Brady et al. for "Polycrystalline Silicon Contact Structure" teaches a contact structure that provides electrical contact between two polycrystalline silicon interconnect layers. The lower layer has a silicide layer on its upper surface. The upper polycrystalline silicon layer can be doped with a different conductivity type, and makes an ohmic contact with the silicided region of the lower polycrystalline silicon layer.

U.S. Pat. No. 5,084,417 of Joshi et al. for "Method for Selective Deposition of Refractory Metals on Silicon Substrates and Device Formed Thereby" describes utilizing high temperature and a silane reduction process in which the flow rate ratio of silane to refractory metal halide gas is less than one. In a second embodiment, an additional layer of the refractory metal is deposited utilizing a hydrogen reduction of the metal halide gas at very high temperatures.

Figure 1A:
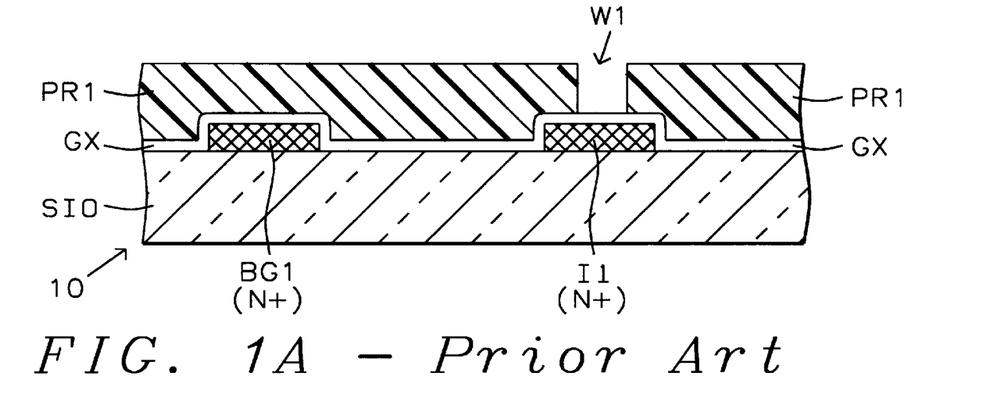
FIGS. 1A–1C illustrate a prior art process for manufacturing an SRAM device.
Figure 1B:
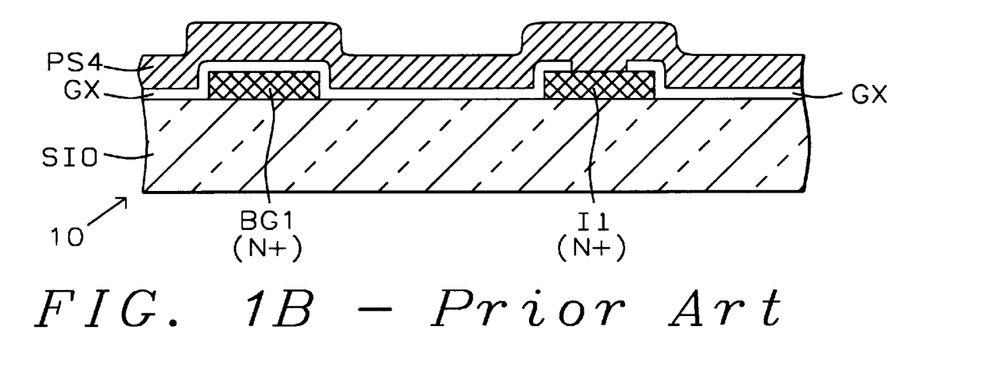
Figure 1C:
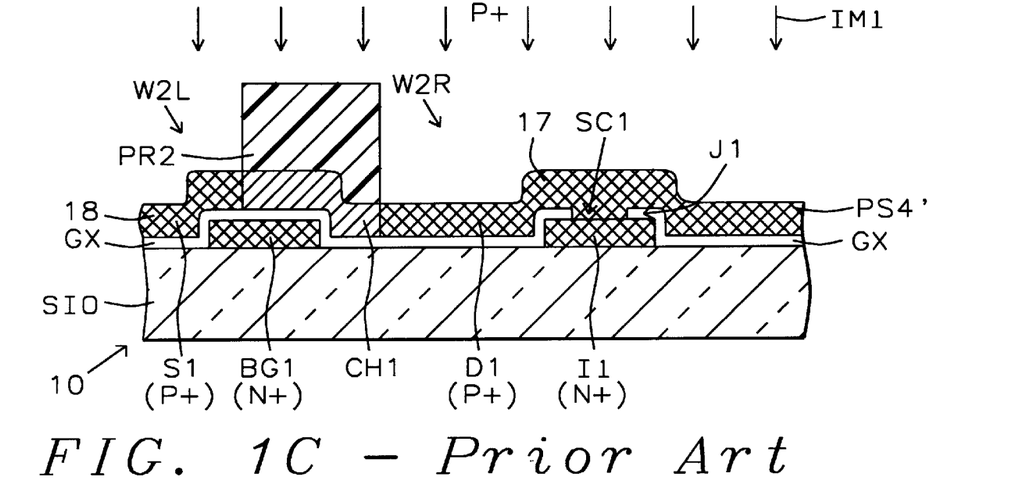

FIGS. 1A–1C illustrate a prior art process for manufacturing an SRAM device 10. Referring to FIG. 1A, a device 10 is formed on a dielectric layer SIO composed of a silicon oxide dielectric material. Layer SIO supports an N+ doped conductive polysilicon bottom gate electrode BG1 and an N+ doped conductive polysilicon interconnection line I1 both formed from an N+ doped (third) polysilicon layer with a thickness from about 100 Å to about 1,000 Å.

The bottom gate electrode BG1, interconnect line I1 and dielectric layer SIO have been doped covered with gate oxide layer GX with a thickness from about 50 Å to about 500 Å.

A first photoresist mask PR1 has been formed over device 10. A window W1 is formed through mask PR1 extending down to the surface of gate oxide layer GX above the interconnection line I1.

FIG. 1B shows the device 10 of FIG. 1A after the gate oxide has been etched away below the window W1 down to the top surface of interconnection line I1, followed by formation of a lightly doped fourth polysilicon (channel) layer PS4, with a thickness from about 100 Å to about 1,000 Å, which reaches down through the window opened in gate oxide layer GX by the etching step to form electrical contact with interconnection line I1. The layer PS4 is doped to the low level appropriate for use in the channel of a Thin Film Transistor (TFT).

FIG. 1C shows the device 10 of FIG. 1B after a second photoresist mask PR2 has been formed covering fourth polysilicon (channel) layer PS4 above bottom gate electrode BG1 and extending to the right thereof. There is a window W2L to the left and a window W2R to the right of mask PR2.

Mask PR2 has been used during the ion implantation of P+ dopant IM1 which is implanted into the exposed portions of fourth polysilicon (channel) layer PS4 to form a source region S1 to the left of mask PR2 and a drain region D1 to the right of mask PR2 in the layer PS4. In addition, to the right of mask PR2, the layer PS4 has been converted into layer PS4' which is an interconnection line. At the intersection of P+ doped line PS4' with the N+ doped interconnection line I1, a PN junction J1 has been formed between the P doped line PS4' and N doped line I1.

The implant IM1 comprises a dose of boron P type dopant from about $1\text{ E }14$ ions/cm$^2$ to about $1\text{ E }16$ ions/cm$^2$ to provide P+ doped polysilicon in the source region S1, line 18, drain region D1, line 17 and interconnection layer PS4' and drain region D1 is connected to a PN junction formed between P+ doped polysilicon line 17 and the N+ doped line I1 below line 17.

Figure 3:
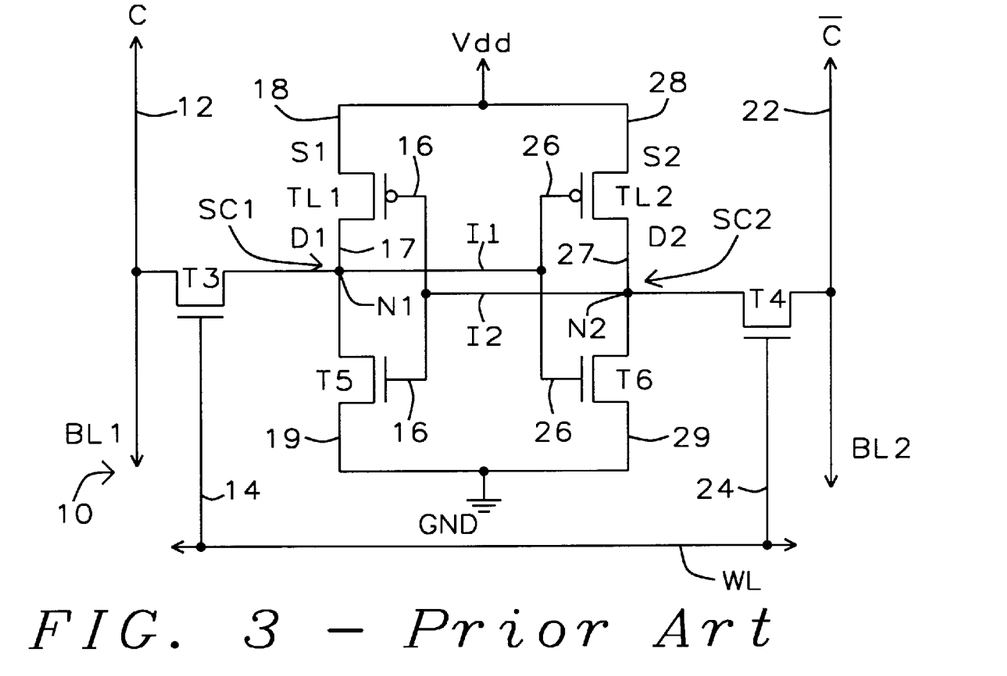
FIG. 3 shows a circuit diagram of a prior art six transistor (6T) Static Random Access Memory (SRAM) cell 10, incorporating the structure of FIG. 1C.

FIG. 3 shows a prior art circuit diagram of a six transistor (6T) Static Random Access Memory (SRAM) cell 10, incorporating the structure of FIG. 1C which includes a first storage node N1 and a second storage node N2, a pair of load transistors TL1 and TL2 having their sources S1 and S2 (composed of P-doped polysilicon) connected through P+ doped polysilicon lines 18 and 28, respectively, to voltage source Vdd. The drain regions D1 and D2 (composed of P-doped polysilicon) of load transistors TL1 and TL2 are connected through P+ doped polysilicon lines 17 and 27 to nodes N1 and N2 where they are connected to the N+ doped interconnection lines I1 and I2, respectively, so a PN junction exists as can be seen by reference of FIG. 1C. The drain of the first latch transistor T5 is connected to the first storage node N1; and the drain of the second latch transistor T6 is connected to the second storage node N2.

The gate electrodes for the first latch transistor T5 and the first load transistor TL1 are connected through conductor line 16 and interconnection line I2 to the second storage node N2. The gate electrodes for the second latch transistor T6 and the second load transistor TL2 are connected through conductor line 26 and interconnection line I1 to the first storage node N1. The gate electrodes for the pass transistors T3 and T4 are connected through lines 14 and 24, respectively, to the word line WL.

The source regions of load transistors TL1 and TL2 connect electrically through P+ doped polysilicon lines 18 and 28 to a power supply terminal (at voltage Vdd) and to each other.

The source regions of the latch transistors T5 and T6 are electrically connected through lines 19 and 29 to ground (reference potential) and to each other.

The source/drain circuit of first pass transistor T3 is connected between the first bit line 12 (BL1) and node N1 and the source/drain circuit of second pass transistor T4 is connected between the node N2 and second bit line 22 (BL2).

The pass transistors T3, T4 and latch transistors T5, T6 are NMOS (N-channel) devices and the load transistors TL1, TL2 are PMOS (P-channel) devices.

There is a contact SC1 connected to the Node N1 and through the interconnection line I1 (buried under gate oxide layer GX) and the conductor line 26 to the gate electrodes of the second latch transistor T6 and the first load transistor TL2.

There is also a contact SC2 connected to the Node N2 and through the interconnection line I2 (buried under gate oxide layer GX) and the conductor line 16 to the gate electrodes of the first latch transistor T5 and the first load transistor TL1.

The P+ doped polysilicon lines 18 and 28 from the source Vdd to the sources S1 and S2 and the P+ doped lines 17 and 27 from drains D1 and D2 to nodes N1 and N2 respectively have substantial amounts of series electrical resistance.

Our studies of the circuit of FIG. 3 show that there are excessively high series electrical resistances of lines 17, 27, 18 and 28 and PN junction diode which exist at contacts SC1/SC2 causing a negligible voltage drop. These are substantial disadvantages of the circuit of FIG. 3.

With the continued scaling of device structures to the deep submicron level, the operating voltages are becoming lower. Thus, the voltage drop across the contacts will no longer play a negligible role in the device performance. Besides the $I_{ON}/I_{OFF}$ ratio and the Subthreshold Swing and the Series Resistance of S/D region or interconnection are also major concerns in TFT SRAM devices.

However, the conventional process of forming inter-polysilicon contacts between the polysilicon 3 and polysilicon 4 layers in an SRAM device has two major disadvantages. First, it will degrade the polysilicon/SiO$_2$ interface quality and thus cause a larger OFF state current ($I_{OFF}$) and a Subthreshold Swing due to the covering of photoresist direct on the gate oxide. Second, it will also degrade the ON state current (IDSAT) of the TFT device because of the voltage drop across the contact result from the existence of PN junction diode.

SUMMARY OF THE INVENTION

Objects of the present invention are as follows:

1. Improve the polysilicon/SiO$_2$ interface quality: Increase Subthreshold Swing, as well as mobility and transconductance $g_m$ and reduce Leakage ($I_{OFF}$)
2. Reduce the voltage drop across the contacts due to the elimination of the PN junction diode at the inter-polysilicon contact (Ohmic contact formation between Tungsten/polysilicon): Increase $I_{ON}$ current.
3. Reduce the series resistance of S/D and Interconnection also improve Subthreshold Swing and Increase $I_{ON}$ and reduce Propagation Delay.
4. Increase the $I_{ON}/I_{OFF}$ ratio (Increase $I_{ON}$ and Reduce $I_{OFF}$)

A new process flow is used to form the Stack Contacts (SC) defined after the deposition of the polysilicon 4 layer to avoid the covering of photoresist directly on the gate oxide layer.

Using, selective deposited tungsten technology to the contact is made between the polysilicon 3 layer and the polysilicon 4 layer and decreases the series resistance of the S/D region and interconnection and eliminate the PN junction diode which exists at contacts SC1/SC2.

DEFINITIONS

Butted Contact

In a silicon gate MOS device, a polysilicon conductor and the active device region "butt" up against each other but do not make direct electrical contact with each other. There is an indirect form of electrical contact between the polysilicon conductor layer and the substrate wherein the polysilicon conductor is aligned with the edge of the active-device region to which contact is to be made. A contact window is opened that overlaps the polysilicon conductor and the active device region of the substrate. Metal is deposited into the window to form an electrical contact between the conductor and the active device region.

In accordance with another aspect of this invention, a MOSFET SRAM device comprises a dielectric layer on the surface of a partially completed SRAM device with pass transistors and latch transistors with the dielectric layer formed above the transistors. A thin film transistor gate electrode and an interconnection line are formed on the dielectric layer. A gate oxide layer over the device covers the gate electrode and the interconnection line. A polysilicon conductive layer covers the gate oxide layer. A channel mask is formed above the gate electrode. Dopant is formed in the polysilicon conductive layer aside from the channel mask forming a source region, a drain region and an interconnect line in the polysilicon conductive layer. There is a window through the polysilicon conductive layer and the gate oxide layer to the interconnection line; and a metal layer above the polysilicon conductive layer extending through the window in butted contact with the interconnection line forming an electrical contact through the gate oxide layer between the interconnection line and the polysilicon conductive layer.

Preferably, the channel mask comprises a silicon oxide structure. The metal layer comprises a tungsten layer above the polysilicon conductive layer in butted contact with the interconnection line and juxtaposed with the silicon oxide structure. The thin film transistor gate electrode and the interconnection line on the dielectric layer are formed of polysilicon doped with N+ dopant. The source region, the drain region and an interconnect line had been implanted with P+ dopant.

BRIEF DESCRIPTION OF THE DRAWINGS

The foregoing and other aspects and advantages of this invention are explained and described below with reference to the accompanying drawings, in which.

DESCRIPTION OF THE PREFERRED EMBODIMENT

Figure 2A:
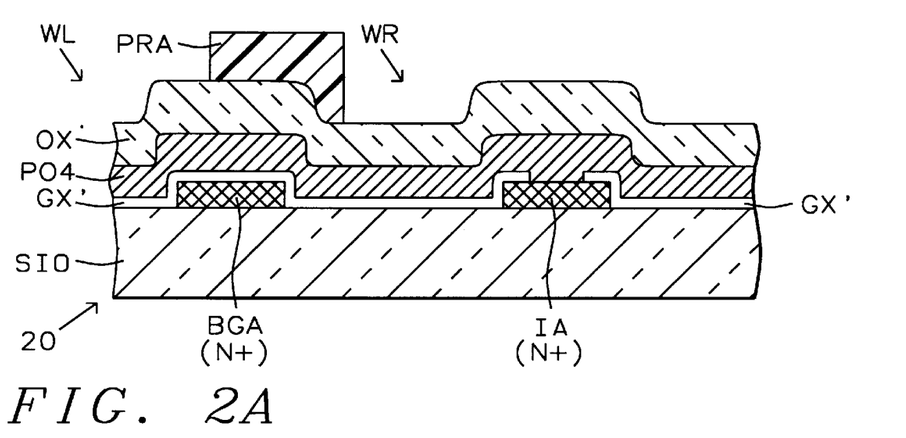
FIGS. 2A–2F illustrate a process for manufacturing a preferred embodiment of an SRAM device in accordance with the method of this invention.

FIGS. 2A–2F illustrate a process for manufacturing a preferred embodiment of an SRAM device in accordance with the method of this invention. Referring to FIG. 2A, devices in accordance with an embodiment of this invention are formed on a dielectric layer SIO composed of a silicon oxide dielectric material. Layer SIO supports an N+ doped conductive polysilicon bottom gate electrode BGA and an N+ doped conductive polysilicon interconnection line IA both formed from an N+ doped (third) polysilicon layer with a thickness from about 100 Å to about 1,000 Å.

The bottom gate electrode BGA, interconnection line IA and dielectric layer SIO have been doped covered with gate oxide layer GX' with a thickness from about 50 Å to about 5,000 Å.

A blanket, lightly doped, (fourth) polysilicon (channel) layer PO4, with a thickness from about 100 Å to about 1,000 Å, has been formed over gate oxide layer GX'. The layer PO4 is doped to the low level appropriate for use in the channel of a Thin Film Transistor (TFT).

A blanket silicon oxide dielectric layer OX with a thickness from about 200 Å to about 2,000 Å has been formed over lightly doped, (fourth) polysilicon (channel) layer PO4 for patterning into a self-aligned masking layer for the channel of a TFT device.

A photoresist mask PRA has been formed over device on the surface of dielectric layer OX which is above the (fourth) polysilicon (channel) layer PO4 20 in the pattern of a self-aligned mask for the channel of a TFT device with windows WL and WR formed on either side of mask PRA extending down to the surface of the silicon oxide dielectric layer OX above the channel region to be formed. The mask PRA is shown to be located directly above most of the bottom gate electrode BGA extending over the right edge of the bottom gate electrode BGA above the gate oxide layer GX'.

Figure 2B:
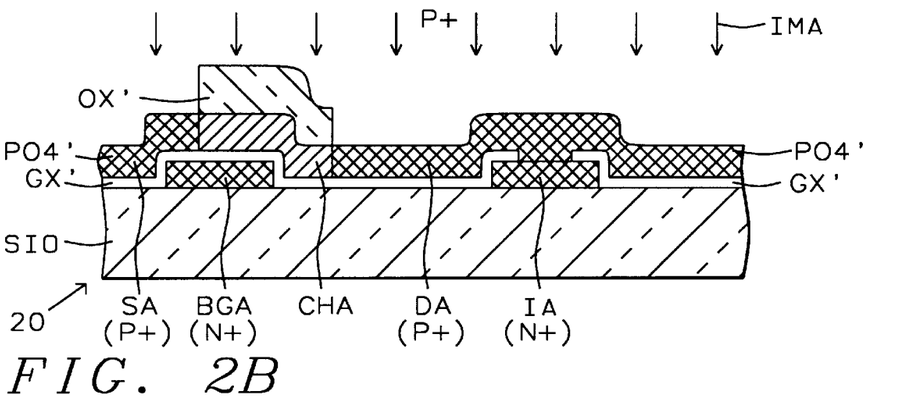

FIG. 2B shows the device 20 of FIG. 2A after the dielectric layer OX has been etched away aside from mask PRA to form a self-aligned mask OX' below the windows WL and WR down to the top surface of channel polysilicon layer PO4 which is exposed to doping with ion implant IMA P+ type dopant comprising a boron dose from about 1 E 14 ions/cm² to about 1 E 64 ions/cm². The self-aligned mask OX'is also located directly above most of the bottom gate electrode BGA extending over the right edge of the bottom gate electrode BGA immediately below the former location of mask PRA as can be seen by comparison with FIG. 2A. After annealing there are P+ doped regions including source region SA in polysilicon layer PO4' to the left of silicon oxide mask OX', P+ doped drain region DA in polysilicon layer PO4' to the right of silicon oxide mask OX' and P+ doped interconnection layer S4' in polysilicon layer PO4' to the right of drain region DA. The channel region CHA beneath the self-aligned silicon oxide dielectric mask OX' is not doped by dopant IMA. The mask PRA is shown above the right edge of the bottom gate electrode BGA.

Figure 2C:
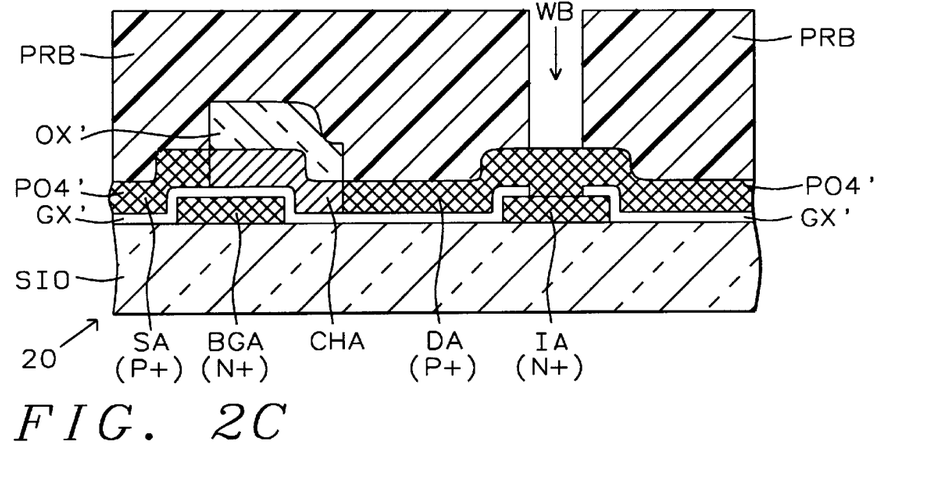

FIG. 2C shows the device 20 of FIG. 2B after a photoresist Stack Contact (SC) mask PRB has been formed over polysilicon layer PO4' and silicon oxide dielectric mask OX'. A window WB is formed through mask PRB extending down to the surface of polysilicon layer PO4' above the interconnection line IA.

Figure 2D:
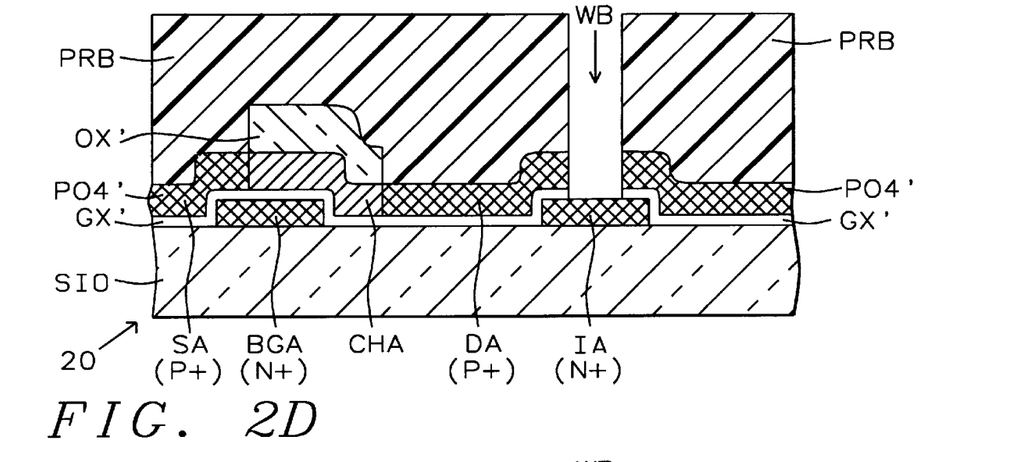

FIG. 2D shows the device 20 of FIG. 2C after the etching polysilicon layer PO4' and gate oxide layer GX' through window WB in photoresist contact mask PRB through to expose a portion of the top surface of interconnection line IA.

Figure 2E:
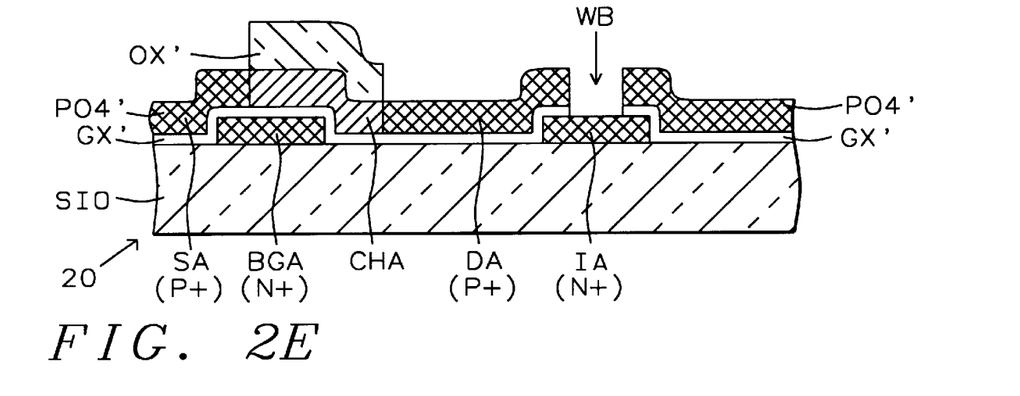

FIG. 2E shows the device 20 of FIG. 2D after the photoresist contact mask PRB has been stripped away from the device 20 leaving the top surface of polysilicon layer PO4', the top surface of silicon oxide mask OX' and the exposed portion of the top surface of interconnection line IA.

Figure 2F:
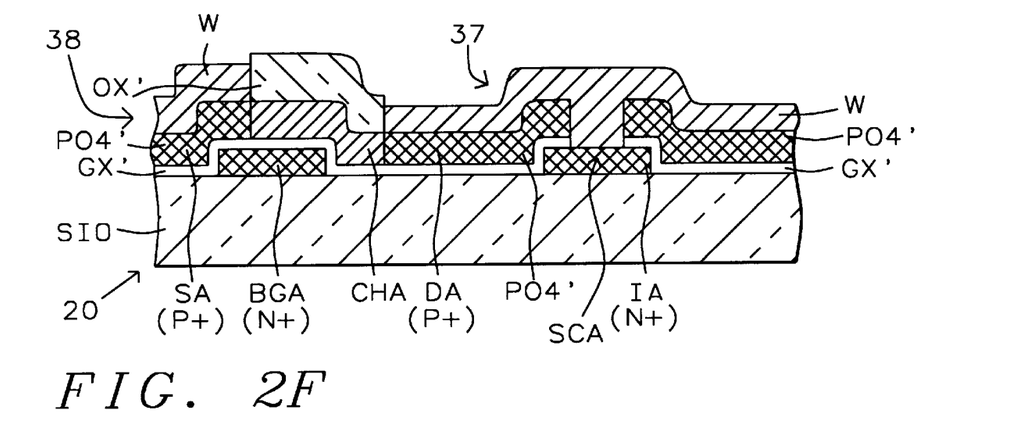

FIG. 2F shows the device 20 of FIG. 2E after a tungsten layer W has been grown selectively over the polysilicon layer PO4', and reaching down through window WB to contact the exposed surface of N+ doped conductive polysilicon interconnection line IA forming a stack contact SC. The tungsten layer and the polysilicon layer PO4' are formed on either side of channel CHA and above the source region SA and drain region SB.

The selective CVD tungsten direct contact silicon (polysilicon) is employed to provide good contact resistance. The contact resistance of tungsten/N+-Si is very low. The contact resistance of tungsten/P+-Si is reasonably low. Wolf, "Silicon Processing for the VLSI Era" Vol. 2. p 129 (1990)

Tungsten can simultaneously serve as a barrier layer. The Silicon consumption is self-limiting at –100 Angstroms if the native oxide layer is less than 10 Angstroms thick. Wolf, supra, p.130. Sufficiently good electrical characteristics are obtained.

However, concerns have been expressed about some of the side effects observed under certain deposition conditions:
1). Lateral encroachment of the tungsten under the $Si/SiO_2$ will occur.
2). Wormholes are occasionally observed at the silicon surface.

The factors mentioned above will produce junction leakage.

This is believed to be feasible if the CVD Tungsten is performed using the silane ($SiH_4$) reduction of tungsten hexafluoride ($WF_6$) to suppress encroachment and wormholes.

$$WF_6 + 3H_2 \rightarrow 1W + 6HF \tag{1}$$

$$2WF_6 + 3SiH_4 \rightarrow 2W + 3SiF_4 + 6H_2 \tag{2}$$

In reaction (2), no HF gas is produced as the reaction by-product, the problems of encroachment and wormholes are also apparently eliminated. Wolf, supra p. 247

The advantages of using $SiH_4$ reduction of $WF_6$: Wolf, supra p. 247
1. The formation of Tungsten films with smoother surface. (Smaller grain size).
2. Low and stable contact resistance to both P or N type Silicon are also formed.

3. Minimal erosion of Silicon and minimal encroachment of Silicon contact.
4. High deposition rates can be achieved at low temperatures (up 600nm per minute at 250° C. has been observed, with no loss of selectivity).

For maximum density to be achieved in a six transistor Static Random Access Memory (6T SRAM) device, the cells must be laid out to have minimum size, i.e occupy as small an area as possible. But conventional device layouts make it difficult to shrink device size due to metal routing and the number of contacts. In accordance with the design and method of the present invention, that problem is overcome.

Achieving MOSFET's with low series resistance, in the S/D diffusion layer, in a 6T SRAM device represents a key issue which must be accomplished to realize high-performance CMOS devices.

Comparison between process of FIGS. 1A–1C and the process of FIGS. 2A–2F
Process of FIGS. 1A–1C
Disadvantages:
1. Photoresist cover on/the gate oxide directly:
   More interface trap density caused by:
      ON state current Degrada
      Mobility Degradation; and
      Transconductance $g_m$ Degradation.
   Worse Subthreshold Swing: means worse switch performance.
   Larger OFF state leakage.
2. The PN junction diode exists at the inter-polysilicon contact:
   lower ON state current (lower driving ability. (Note that DOWN means an ON state current decrease)
3. The series resistance of S/D and Interconnection:
   Worse Subthreshold Swing
   $I_{ON}$→DOWN, lower ON state current.
   Propagation Delay→UP; larger Propagation Delay.
Advantages of process of FIGS. 2A–2F.
1. Improve the polysilicon/$SiO_2$ interface quality: Improve Subthreshold Swing and Leakage ($I_{OFF}$) and mobility and transconductance $g_m$.
2. Reduce the voltage drop across the contact due to the elimination of the PN junction diode at the inter-polysilicon contact (Ohmic contact formation between tungsten/polysilicon): Increase $I_{ON}$ current.
3. Reduce the series resistance of S/D and Interconnection-Improve Subthreshold Swing and Increase $I_{ON}$ and decrease Propagation Delay.
4. Increase the $I_{ON}/I_{OFF}$ ratio (Increase $I_{ON}$ and Reduce $I_{OFF}$).

Figure 4:
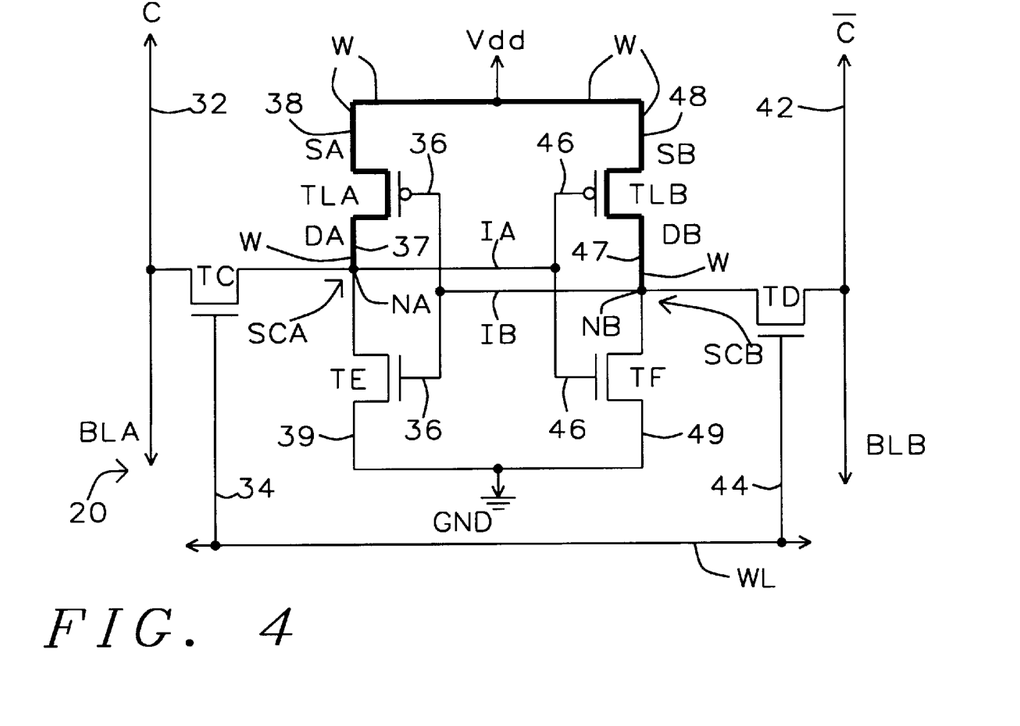
FIG. 4 shows a circuit diagram of a six transistor (6T) Static Random Access Memory (SRAM) cell, in accordance with this invention, incorporating the structure of FIG. 2F

FIG. 4 shows a circuit diagram of a six transistor (6T) Static Random Access Memory (SRAM) cell 20, in accordance with this invention, incorporating the structure of FIG. 2F which includes a first storage node NA and a second storage node NB. A pair of load transistors TLA and TLB have their sources SA and SB connected through interconnect lines 38 and 48 P+ doped polysilicon/tungsten laminated, respectively, to voltage source Vdd. Load transistors TLA and TLB have drain regions DA and DB connected through P+ doped polysilicon/tungsten laminated interconnect lines 37 and 47 to nodes NA and NB and the N+ doped interconnection lines IA and IB, respectively. The drain of the first latch transistor TE is connected to the first storage node NA; and the drain of the second latch transistor TF is connected to the second storage node NB.

The gate electrodes for the first latch transistor TE and first load transistor TLA are connected through conductor line 36 and interconnect line IB to the second storage node NB. The gate electrodes for the second latch transistor TF and the second load transistor TLB are connected through conductor line 46 and interconnection line IA to the first storage node NA. The gate electrodes for the pass transistors TC and TD are connected through lines 34 and 44, respectively, to the word line WL.

The source regions of load transistors TLA and TLB are electrically connected through interconnect lines 38 and 48 to power supply terminal (at voltage Vdd) and to each other.

There is a contact SCA connected to the Node NA and and a contact SCB connected to the Node NB.

The contact SCA is connected to the Node NA and through the interconnection line IA (buried under gate oxide layer GX') and the conductor line 46 to the gate electrodes of the second latch transistor TF and the first load transistor TLB.

The contact SCB is connected to the Node NB and through the interconnection line IB (buried under gate oxide layer GX') and the conductor line 36 to the gate electrodes of the first latch transistor TE and the first load transistor TLA.

The low series electrical resistance of interconnect lines 37, 47, 38 and 48 is a substantial advantage of the circuit of FIG. 4 because the voltage drop across the series resistances of those lines is decreased substantially with the tungsten lines provided in FIG. 4 eliminating the disadvantage of the PN junction diodes at the contacts SCA/SCB.

The source regions of the latch transistors TE and TF are electrically connected through interconnect lines 39 and 49 to ground (reference potential) and to each other.

The source/drain circuit of the first pass transistor TC is connected between the bit line BL1 and node NA.

The source/drain circuit of the second pass transistor TD is connected between the node NB and the bit line BL2.

The pass transistors TC, TD and latch transistors TE, TF are NMOS (N-channel) devices and the load transistors TLA, TLB are PMOS (P-channel) devices.

While this invention has been described in terms of the above specific embodiment, those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

Appendix

The Impact of Fluorine on the $Si/SiO_2$ Interface and the Quality of Gate Oxide Decrease of the gate oxide dielectric constant:[ref(1)]
A 7% decrease of the gate oxide dielectric constant occurs after annealing at 900° C.

Increase of the gate oxide thickness :[ref(1)] Annealing temperature above 900° C., an increase of the physical film thickness is observed.

Fluorine is found to have caused an improvement in interfacial properties: [ref(2)]
  Improved hot carrier resistance in MOSFET has been observed for fluorinated gate oxides. [ref(3)]
  The improved hot-electron hardness will be explained by a model involving strain relaxation near the $SiO_2/Si$ interface by fluorine incorporation.[ref(4)]
  The fluorinated oxide give rise to a significant improvement in hot-electron hardness due to the reduced generation rates of interface traps. [(ref(4)]

The fluorine leads to a degradation in charge-to-breakdown of gate oxide. [ref(5)]

References
1. IEEE EDL14, N05, MAY 1993.
2. IEEE ED36, N05, MAY 1993.
3. IEEE EDL11, NO1, JUNE 1990.
4. IEEE EDL10, N04, APRIL 1989.
5. IEEE EDL10, N08, AUGUST 1989.

Having thus described the invention, what is claimed as new and desirable to be secured by Letters Patent is as follows:

1. A MOSFET device comprising:

a semiconductor SRAM device including NMOS FET devices including pass transistors and latch transistors with a dielectric layer formed over surfaces thereof, a thin film transistor gate electrode and an interconnection line formed on said dielectric layer, said gate electrode having a top surface, a gate oxide layer covering said gate electrode and said interconnection line and said dielectric layer, a polysilicon conductive layer formed over said gate oxide layer including therein a TFT channel region formed over said gate electrode and a source region and a drain region and an interconnect conductor formed therein, said polysilicon conductive layer having a top surface, a channel mask comprising a silicon oxide structure formed above said channel region and self-aligned with said channel region, said channel mask and said channel region being formed over at least a portion of said top surface of said gate electrode, said source region and said drain region being juxtaposed with said channel region proximate to the edges of said gate electrode, and an electrical contact formed extending through said gate oxide layer between said interconnection line and said polysilicon conductive layer.

2. A device in accordance with claim 1 including:

a metal layer formed on said top surface of said polysilicon conductive layer aside from said channel mask and said channel region and juxtaposed therewith in butted contact with said interconnection line.

3. A device in accordance with claim 1 including:

a tungsten layer formed on said top surface of said polysilicon conductive layer aside from said channel mask and said channel region and juxtaposed therewith in butted contact with said interconnection line.

4. A device in accordance with claim 1 including:

a metal layer formed on said top surface of said polysilicon conductive layer aside from said channel mask and said channel region in butted contact with said interconnection line and juxtaposed with said silicon oxide structure of said channel mask.

5. A device in accordance with claim 1 including:

a tungsten metal layer formed on said top surface of said polysilicon conductive layer in butted contact with said interconnection line and juxtaposed with said silicon oxide structure of said channel mask.

6. A device in accordance with claim 1 including as follows:

said thin film transistor gate electrode and said interconnection line on said dielectric layer are formed of polysilicon doped with N+ dopant, a P+ dopant implanted into said polysilicon conductive layer aside from said channel mask forming a source region, a drain region and an interconnect line in said polysilicon conductive layer, and said channel mask comprises a silicon oxide structure, and a tungsten metal layer formed on said top surface of said polysilicon conductive layer aside from said channel mask and said channel region in butted contact with said interconnection line and juxtaposed with said silicon oxide structure of said channel mask.

7. A MOSFET SRAM device comprising:

a dielectric layer on the surface of a partially completed SRAM device with pass transistors and latch transistors, said dielectric layer formed above said transistors, a thin film transistor gate electrode and an interconnection line on said dielectric layer, a gate oxide layer over said device covering said gate electrode and said interconnection line, a polysilicon conductive layer over said gate oxide layer with a channel region formed in said polysilicon conductive layer, a channel mask composed of a dielectric layer formed above said channel region and self-aligned with said channel region, said channel mask and said channel region being formed over at least a portion of said top surface of said gate electrode, dopant in said polysilicon conductive layer aside from said channel mask forming a source region, a drain region and an interconnect line in said polysilicon conductive layer, a window through said polysilicon conductive layer and said gate oxide layer to said interconnection line, a metal layer formed above said polysilicon conductive layer aside from said channel mask and said channel region extending through said window in butted contact with said interconnection line forming an electrical contact through said gate oxide layer between said interconnection line and said polysilicon conductive layer of said channel mask.

8. A device in accordance with claim 7 wherein said metal layer comprises tungsten.

9. A device in accordance with claim 7 wherein:

said channel mask comprises a silicon oxide structure, and said metal layer comprises a tungsten layer juxtaposed with said silicon oxide structure of said channel mask.

10. A device in accordance with claim 7 including:

said channel mask comprising a silicon oxide structure, said metal layer comprises a tungsten layer above said polysilicon conductive layer in butted contact with said interconnection line and juxtaposed with said silicon oxide structure of said channel mask.

11. A device in accordance with claim 7 including as follows:

said thin film transistor gate electrode and said interconnection line on said dielectric layer are formed of polysilicon doped with N+ dopant, said source region, said drain region and said interconnect line having been implanted with P+ dopant, said channel mask comprising a silicon oxide structure, and said metal layer comprising a tungsten layer above said polysilicon conductive layer in butted contact with said interconnection line and juxtaposed with said silicon oxide structure.

* * * * *

UNITED STATES PATENT AND TRADEMARK OFFICE
CERTIFICATE OF CORRECTION

PATENT NO. : 6,078,087
DATED : June 20, 2000
INVENTOR(S) : Kuo Ching Huang, Yean-Kuen Fang, Mong-Song Liang
Cheng-Yeh Shih, Dun Nian Yaung It is certified that error appears in the above-identified patent and that said Letters Patent is hereby corrected as shown below:

On the Title page, in item (54), pleas add TFT to the Title so that it reads; --TFT SRAM MEMORY DEVICE WITH IMPROVED PERFORMANCE--.

Signed and Sealed this

First Day of May, 2001

Attest:

NICHOLAS P. GODICI

Attesting Officer

Acting Director of the United States Patent and Trademark Office